(12) United States Patent
Huang

(10) Patent No.: US 6,417,059 B2
(45) Date of Patent: Jul. 9, 2002

(54) PROCESS FOR FORMING A SILICON-GERMANIUM BASE OF A HETEROJUNCTION BIPOLAR TRANSISTOR

(75) Inventor: Feng-Yi Huang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/867,373

(22) Filed: May 29, 2001

Related U.S. Application Data

(62) Division of application No. 09/480,033, filed on Jan. 10, 2000, now Pat. No. 6,251,738.

(51) Int. Cl.[7] .............................................. H01L 21/331
(52) U.S. Cl. ...................... 438/312; 438/318; 438/359
(58) Field of Search ................................ 438/318, 319, 438/312, 359

(56) References Cited

U.S. PATENT DOCUMENTS

| | | | |
|---|---|---|---|
| 5,064,772 A | 11/1991 | Jambotkar | 438/320 |
| 5,250,448 A | 10/1993 | Hamasaki et al. | 438/312 |
| 5,256,550 A | 10/1993 | Laderman et al. | 438/509 |
| 5,331,186 A | 7/1994 | Morizuka | 257/198 |
| 5,399,511 A | 3/1995 | Taka et al. | 438/311 |
| 5,494,836 A | 2/1996 | Imai | 438/312 |
| 5,506,427 A | 4/1996 | Imai | 257/197 |
| 5,523,243 A | 6/1996 | Mohammad | 438/312 |
| 5,648,280 A | 7/1997 | Kato | 438/312 |
| 5,672,522 A | 9/1997 | Streit et al. | 438/312 |
| 5,773,350 A | 6/1998 | Herbert et al. | 438/364 |
| 6,040,225 A | 3/2000 | Boles | 438/341 |
| 6,251,738 B1 * | 6/2001 | Huang | 438/312 |

FOREIGN PATENT DOCUMENTS

EP        541971        5/1993

OTHER PUBLICATIONS

Fumihiko Sato et al., "A Self–Aligned SiGe Base Bipolar Technology Using Cold Wall UHV/CVD and Its Application to Optical Communication IC'S" IEEE Trams. Electron Devices, vol. 42, pp. 82–88 (1995).

Fumihiko Sato et al., Sub–20 ps ECL Circuits with High-Performance Super Self–Aligned Selectively Grown SiGe Base (SSSB) Bipolar Transistors, IEEE Trans. Electron Devices, vol. 42, pp. 483–488 (1995).

* cited by examiner

*Primary Examiner*—Trung Dang
(74) *Attorney, Agent, or Firm*—Ratner & Prestia; Joseph P. Abate, Esq.

(57) ABSTRACT

A process for forming a silicon-germanium base of a heterojunction bipolar transistor. First, a silicon substrate having a mesa surrounded by a trench is formed. Next, a silicon-germanium layer is deposited on the substrate and the portion of the silicon-germanium layer adjacent the mesa is removed to form the silicon-germanium base. In a second embodiment, the process comprises the steps of forming a silicon substrate having a mesa surrounded by a trench, forming a dielectric layer in the trench adjacent the mesa, and growing a silicon-germanium layer on the mesa top surface using selective epitaxial growth to form the silicon-germanium base.

5 Claims, 4 Drawing Sheets

PROCESS FOR FORMING A SILICON-GERMANIUM BASE OF A HETEROJUNCTION BIPOLAR TRANSISTOR

This application is a divisional of U.S. patent application Ser. No. 09/480,033 filed on Jan. 10, 2000, now U.S. Pat. No. 6,251,738.

TECHNICAL FIELD

The present invention relates to heterojunction bipolar transistors. More particularly, this invention relates to a process for forming a silicon-germanium base of a heterojunction bipolar transistor.

BACKGROUND OF THE INVENTION

Transistors are used as either amplifying or switching devices in electronic circuits. In the first application, the transistor functions to amplify small ac signals. In the second application, a small current is used to switch the transistor between an "on" state and an "off" state.

The bipolar transistor is an electronic device with two p-n junctions in close proximity. The bipolar transistor has three device regions: an emitter, a collector, and a base disposed between the emitter and the collector. Ideally, the two p-n junctions (the emitter-base and collector-base junctions) are in a single layer of semiconductor material separated by a specific distance. Modulation of the current flow in one p-n junction by changing the bias of the nearby junction is called "bipolar-transistor action."

External leads can be attached to each of the three regions and external voltages and currents can be applied to the device using these leads. If the emitter and collector are doped n-type and the base is doped p-type, the device is an "npn" transistor. Alternatively, if the opposite doping configuration is used, the device is a "pnp" transistor. Because the mobility of minority carriers (i.e., electrons) in the base region of npn transistors is higher than that of holes in the base of pnp transistors, higher-frequency operation and higher-speed performances can be obtained with npn devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterostructures comprising heterojunctions can be used for both majority carrier and minority carrier devices. Among majority carrier devices, heterojunction bipolar transistors in which the emitter is formed of silicon and the base of a silicon-germanium alloy have recently been developed. The silicon-germanium alloy (often expressed simply as silicon-germanium) is narrower in band gap than silicon.

The use of silicon-germanium for the base can enhance the efficiency of carrier injection from the emitter into the base and, in consequence, current gain "g" becomes sufficiently high even though the impurity concentration in the silicon-germanium base is made higher than that in the conventional silicon base by more than one order of magnitude. With a silicon-germanium base, high performance at high frequencies can be realized by sufficiently raising the doping level in the base and reducing the base width. Furthermore, there is a possibility of improving the cut-off frequency (shortening the emitter-base diffusion time, $\tau_{ed}$) and, consequentially, further enhancing the high-frequency characteristics by grading the germanium profile in the silicon-germanium base.

The advanced silicon-germanium bipolar complementary metal-oxide-semiconductor (BiCMOS) technology uses a silicon-germanium base in the heterojunction bipolar transistor. In the high frequency (such as multi-GHz) regime, conventional compound semiconductors such as GaAs and InP currently dominate the market for high speed wired and wireless communications. Silicon-germanium BiCMOS promises not only a comparable performance to GaAs in devices such as power amplifiers, but also a substantial cost reduction due to the integration of heterojunction bipolar transistors with standard CMOS, yielding the so-called "system on a chip."

It is advantageous to have a higher germanium content in the silicon-germanium base. It has been a major challenge, however, to deposit high quality silicon-germanium film with a high germanium content. It is well known that germanium has a constant about 4% larger than the lattice constant of silicon. When silicon-germanium is grown on a silicon substrate, silicon-germanium will experience a compressive strain due to the lattice mismatch between the silicon-germanium and the silicon substrate. As the silicon-germanium thickness increases above a certain thickness, known as the critical thickness, the energy of the misfit strain increases such that it becomes energetically favorable for dislocation to generate in the alloy film. It is well known that dislocation is detrimental to device performance, especially for bipolar devices, leading to high leakage current and low breakdown. As the germanium content in the silicon-germanium increases, the critical thickness decreases due to a larger lattice mismatch. For a germanium content of 50%, the critical thickness is only about 10 nm, which is too thin for most of the heterojunction bipolar transistor base layers.

For example, silicon-germanium with 10% germanium content has a critical thickness of about 100 nm. With a 100 nm base thickness, previous research has shown that the germanium content can be increased to about 15% without severely degrading the device performance. Further increases of germanium content above 20% produce degradation of the heterojunction bipolar transistor performance due to the generation of misfit dislocations in the silicon-germanium base.

One process of fabricating a heterojunction bipolar transistor having a silicon-germanium base is provided by Fumnihiko Sato et al. in their article titled, "A Self-Aligned SiGe Base Bipolar Technology Using Cold Wall UHV/CVD and Its Application to Optical Communication IC's," IEEE Trans. Electron Devices, Vol. 42, pp. 82–88 (1995). The heterojunction bipolar transistor of Sato et al. uses selective growth of a silicon-germanium base film on a specially constructed structure to form a silicon-germanium base, a process which is very complex. In addition, the silicon-germanium base of Sato et al. is surrounded on the sides by a dielectric layer when it is formed, which affects the strain release of the silicon-germanium base.

U.S. Pat. No. 5,399,511 issued to Taka et al. provides another process of fabricating a heterojunction bipolar transistor having a silicon-germanium base. Unfortunately, the process of Taka et al. suffers from some of the same limitations as that of the process of Sato et al. Specifically, the silicon-germanium base of Taka et al. is surrounded on the sides by a dielectric layer when it is formed, which affects the strain release of the silicon-germanium base.

There remains a need for a process of forming a silicon-germanium base of a heterojunction bipolar transistor which has a high germanium content in the base and which does not generate misfit dislocations.

SUMMARY OF THE INVENTION

The deficiencies of the conventional processes used to form silicon-germanium bases in heterojunction bipolar transistors show that a need exists for a new process for forming a silicon-germanium base with a high germanium content for a heterojunction bipolar transistor. To overcome the shortcomings of conventional processes for forming silicon-germanium bases, a new process is provided. It is an object of the present invention to provide a new process for forming a silicon-germanium base for a heterojunction bipolar transistor.

In a first embodiment, a process for forming a silicon-gerranium base comprises the steps of forming a silicon substrate having a mesa surrounded by a trench, depositing a silicon-germanium layer on the substrate, and removing the silicon-germanium layer adjacent the mesa to form the silicon-germanium base. In a second embodiment, a process for forming a silicon-germanium base comprises the steps of forming a silicon substrate having a mesa surrounded by a trench, forming a dielectric layer in the trench adjacent the mesa, and growing a silicon-germanium layer on the mesa top surface using selective epitaxial growth to form the silicon-germanium base.

The present invention also includes a process for fabricating a heterojunction bipolar transistor comprising a silicon-germanium base. In a first step, a silicon substrate having a collector and a mesa surrounded by a trench are formed. Next, a silicon-germanium- base is formed on the top surface of the mesa and a silicon nitride layer is formed on the top surface of the silicon-germanium layer. A dielectric layer is then formed adjacent the silicon-germanium base. The dielectric layer is formed such that it fills the trench and leaves a portion of the silicon-germanium base side wall exposed. An extrinsic base is then formed on the dielectric layer such that the extrinsic base covers the exposed portion of the silicon-germanium base side wall. Next, a silicon nitride cap is formed on the extrinsic base. A portion of the silicon nitride cap and extrinsic base are then removed to expose a portion of the silicon nitride layer. Then, a self-aligned spacer is formed on a portion of the exposed silicon nitride layer adjacent the extrinsic base and silicon nitride cap. Next, the remaining exposed portion of the silicon nitride layer is removed to expose a portion of the silicon-germanium base top surface. An emitter is then formed on the exposed portion of the silicon-germanium base top surface, thereby forming the heterojunction bipolar transistor.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be illustrated with reference to the figures in which the same numbers indicate the same elements in all figures. Such figures are intended to be illustrative, rather than limiting, and are included to facilitate the explanation of the process of the present invention.

Figure 1:
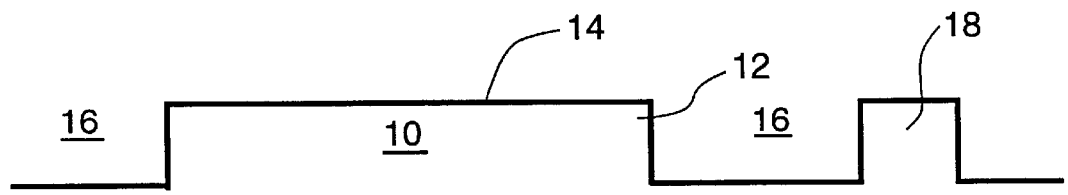
FIG. 1 illustrates a silicon substrate having a collector and having a mesa surrounded by a trench.

With reference to FIG. 1, the process of the invention begins by forming a silicon substrate 10 having a mesa 12. The mesa 12 has a mesa top surface 14. The silicon substrate 10 also has a trench 16 which surrounds the mesa 12 and a collector 18. The silicon substrate 10 of the invention, such as that illustrated in FIG. 1, can be formed using techniques which are well known to those of ordinary skill in the art. In a preferred embodiment, the mesa 12, trench 16, and collector 18 of the silicon substrate 10 are formed by selectively etching a portion of the silicon substrate 10 to form the trench 16, while leaving the collector 18 and mesa 12.

The collector 18 can be doped with either an n-type or p-type dopant such that the collector is of opposite dopant type from the dopant of the silicon-germanium layer (described below). Thus, if the silicon-germanium layer is doped with an n-type dopant, such as phosphorous or arsenic, the collector 18 is doped with a p-type dopant, such as boron. Conversely, if the silicon-germanium layer is doped with a p-type dopant, the collector is doped with an n-type dopant. Preferably, the collector 18 is doped with an n-type dopant (e.g., phosphorous or arsenic). The collector- 18 can be doped using conventional techniques which are well known to those of ordinary skill in the art.

Figure 2:
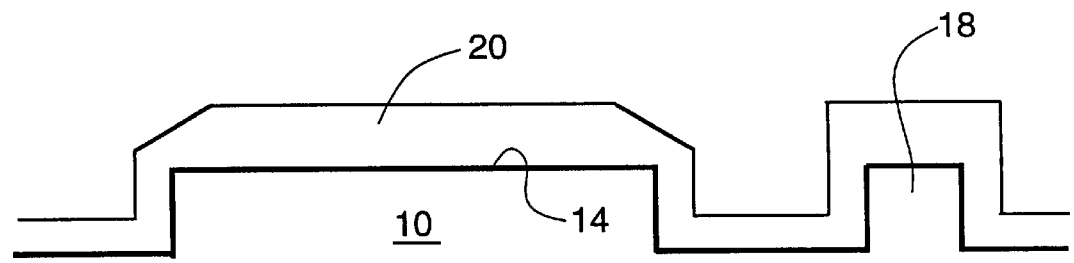
FIG. 2 illustrates the silicon substrate of FIG. 1 having a silicon-germanium layer formed on the substrate.

In the next step of the process of the invention, a silicon-germanium layer 20 is formed on the silicon substrate 10. The resulting structure is illustrated in FIG. 2. As shown in FIG. 2, the silicon-germanium layer 20 can be formed such that it covers the mesa top surface 14, trench 16, and collector 18 of the silicon substrate 10. Preferably, the silicon-germanium layer 20 is formed by the chemical vapor deposition (CVD) technique or molecular beam epitaxy technique. CVD is a process for depositing a thin film of material onto a substrate by reacting the constituent elements in gaseous phase. CVD processes can be used to produce thin, single-crystal films called epitaxial films.

Preferably, the silicon-germanium layer 20 is doped with an n-type or p-type dopant of opposite type dopant from the dopant, if any, of the-collector 18. In a preferred embodiment, the collector 18 is doped with an n-type dopant and the silicon-germanium layer 20 is doped with a p-type dopant. The silicon-germanium layer 20 can doped using conventional techniques which are well known to those of ordinary skill in the art.

Figure 3:
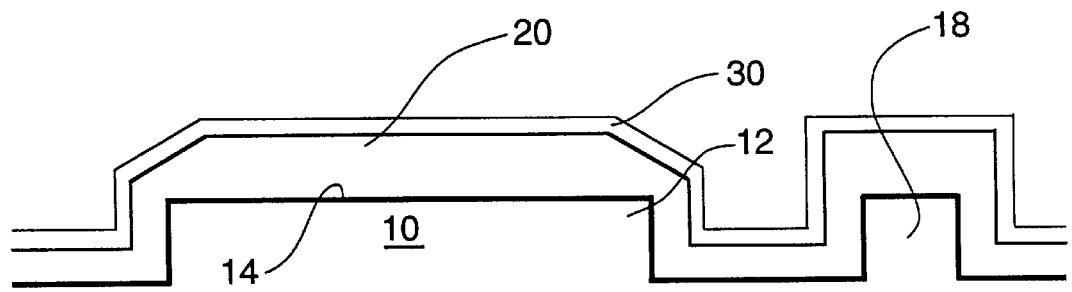
FIG. 3 illustrates the structure of FIG. 2 further having a silicon nitride layer formed on the silicon-germanium layer.

Following formation of the silicon-germnanium layer 20, a silicon nitride layer 30 is formed on the silicon-germanium layer 20. The resulting structure is illustrated in FIG. 3. The silicon nitride layer 30 can be formed on the silicon-germanium layer 20 using techniques which are well known to those of ordinary skill in the art, such as CVD.

Figure 4:
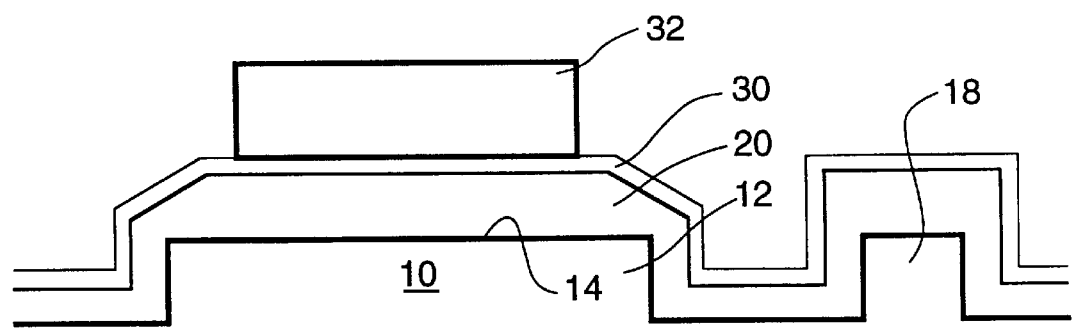
FIG. 4 illustrates the structure of FIG. 3 after a resist has been formed on the silicon nitride layer adjacent the top surface of the mesa.

In the next step of the process of the invention, a resist 32 is formed on the silicon nitride layer 30 adjacent the top surface 14 of the mesa 12. The resulting structure is illustrated in FIG. 4. The resist 32 can be selected from those materials conventionally used as resists and can be formed on the silicon nitride layer 30 using techniques which are well known to those of ordinary skill in the art.

Following formation of the resist 32, the process of the present invention removes those portions of the silicon nitride layer 30 and the silicon-germanium layer 20 that are exposed (i.e., the portions that are not covered by the resist 32). By removing the exposed portions of the silicon nitride layer 30 and the silicon-germanium layer 20, the portion of the silicon-germanium layer 20 adjacent the mesa 12 is removed and the portion of the silicon-germanium layer 20 covered by the resist 32 is retained, thereby forming a silicon-germanium base 22 (illustrated in FIG. 5). The silicon-germanium base 22 has a side wall 24.

Figure 5:
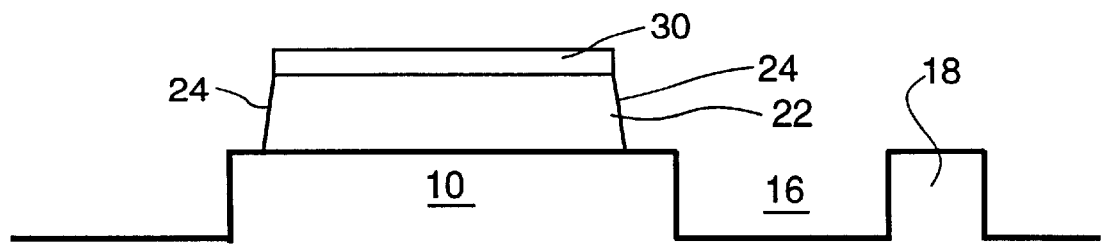
FIG. 5 illustrates the structure of FIG. 4 following removal of the exposed portion of the silicon nitride layer and the silicon-germanium layer, i.e. the area not protected by the resist shown in FIG. 4.

Following removal of the portion of the silicon-germanium layer 20 adjacent the mesa 12, the resist 32 is then removed. FIG. 5 illustrates the resulting structure. The portions of the silicon nitride layer 30 and the silicon-germanium layer 20 which are not covered by the resist 32 can be removed using techniques well known to those of ordinary skill in the art, such as etching.

Figure 6:
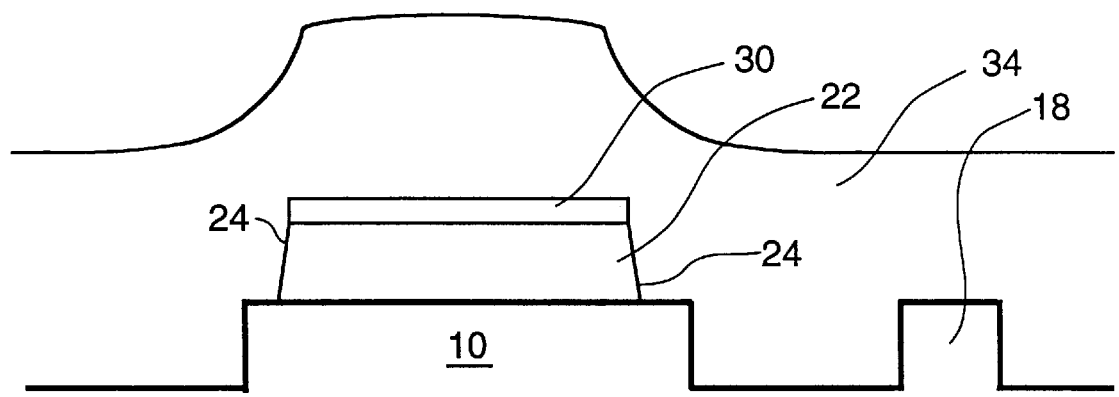
FIG. 6 illustrates the structure of FIG. 5 having a dielectric layer formed on the structure.

In the next step of the process of the invention, a dielectric layer 34 is formed such that the dielectric layer 34 fills the trench 16 and covers at least a portion of the silicon-germanium base side wall 24. The dielectric layer 34 can be formed by depositing a blanket layer on the silicon substrate 10, collector 18, silicon-germanium base 22, and silicon nitride layer 30. The resulting structure is illustrated in FIG. 6. The dielectric layer 34 is then removed such that a portion of the side wall 24 of the silicon-germanium base 22 is exposed. The removal of the dielectric layer 34 can be achieved using techniques well known to those of skill in the art, such as chemical-mechanical polishing (CMP) combined with etching. The dielectric layer 34 can be any of those dielectrics conventionally used, such as a silicon oxide.

Figure 7:
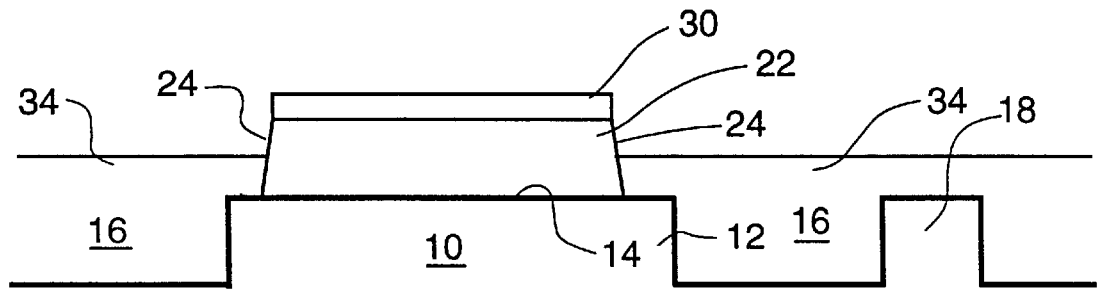
FIG. 7 illustrates the structure of FIG. 6 after the dielectric layer is partially removed such that a portion of the silicon-germanium side wall is exposed.

FIG. 7 illustrates one embodiment of the silicon-germanium base 22 of the invention. As shown in FIG. 7, the silicon-germanium base 22 is disposed on the top surface 14 of the mesa 12. Moreover, the silicon-germanium base 22 is surrounded by a trench 16 filled with the dielectric layer 34.

Figure 8:
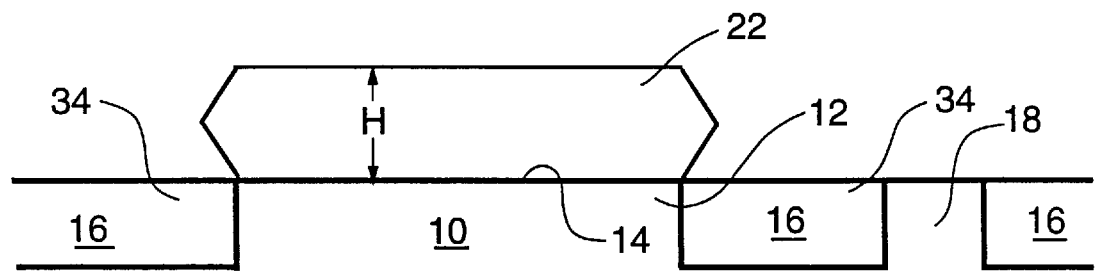
FIG. 8 illustrates a silicon substrate having a mesa, surrounded by a trench filled with a dielectric layer, and a silicon-germanium base disposed on the mesa.

In a second embodiment of the present invention, the silicon-germanium base 22 can be formed using the selective epitaxial growth technique. First, the dielectric layer 34 is formed in the trench 16 of the silicon substrate 10 illustrated in FIG. 1. Next, the silicon-germanium base 22 is grown, using selective epitaxial growth, from the top surface 14 of the mesa 12. The resulting structure is illustrated in FIG. 8.

By forming the silicon-germanium base 22 on the finite-sized mesa 12, the critical thickness of the silicon-germanium base 22 can be substantially increased. This is because of the strain relaxation of the silicon-germanium to the mesa edge. In contrast to a bulk uniform silicon substrate, in which all of the strain in the silicon-germanium has to reside in the silicon-germanium, the relatively small-sized silicon mesa enables the dislocation generated in the silicon-germanium to migrate towards the boundary of the mesa structure, leaving the silicon-germanium with a reduced strain and dislocation density. It is estimated that, with a mesa of about $0.5 \times 2.5 \mu m$, the germanium content in the silicon-germanium base 22 of about 100 nm thick can be from about 10% to about 60%. Preferably, the germanium content in the silicon-germanium base 22 of the present invention is from about 15% to about 60%. More preferably, the germanium content in the silicon-germanium base 22 is from about 25% to about 60%. The silicon-germanium base 22 has a preferred thickness (shown in FIG. 8 along arrows H) of from about 20 nm to about 100 nm. More preferably, the silicon-germanium base 22 has a thickness of from about 40 nm to about 80 nm.

Figure 9:
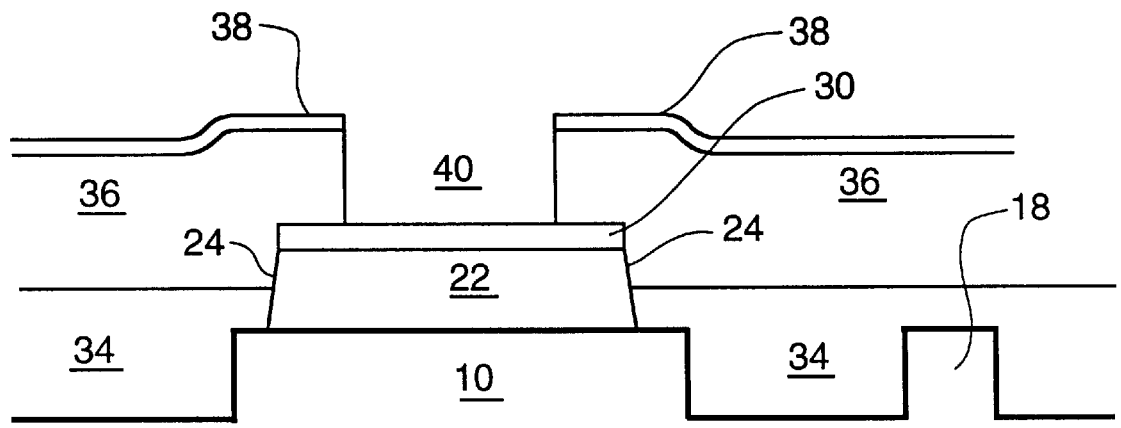
FIG. 9 illustrates the structure of FIG. 7 further having an extrinsic base and a silicon nitride cap formed on the dielectric layer, the extrinsic base covering the exposed portion of the silicon-germanium base side wall, and having an opening to expose a portion of the silicon nitride layer.

Following formation of the silicon-germanium base 22, the remaining components of the heterojunction bipolar transistor can be formed to complete the heterojunction bipolar transistor fabrication. In one embodiment, an extrinsic base 36 is next formed on the dielectric layer 34 such that the extrinsic base 36 covers the exposed portion of the side wall 24 of the silicon-germanium base 22. The extrinsic base 36 can be composed of any of those materials conventionally used as an extrinsic base, such as silicon or silicon-germanium. The extrinsic base 36 is then covered by a silicon nitride cap 38, and an opening 40 is formed to expose a portion of the silicon nitride layer 30. The resulting structure is illustrated in FIG. 9. The silicon nitride cap 38 can be formed using conventional techniques, such as CVD. The opening 40 can be formed using techniques which are well known to those of skill in the art, such as etching.

Figure 10:
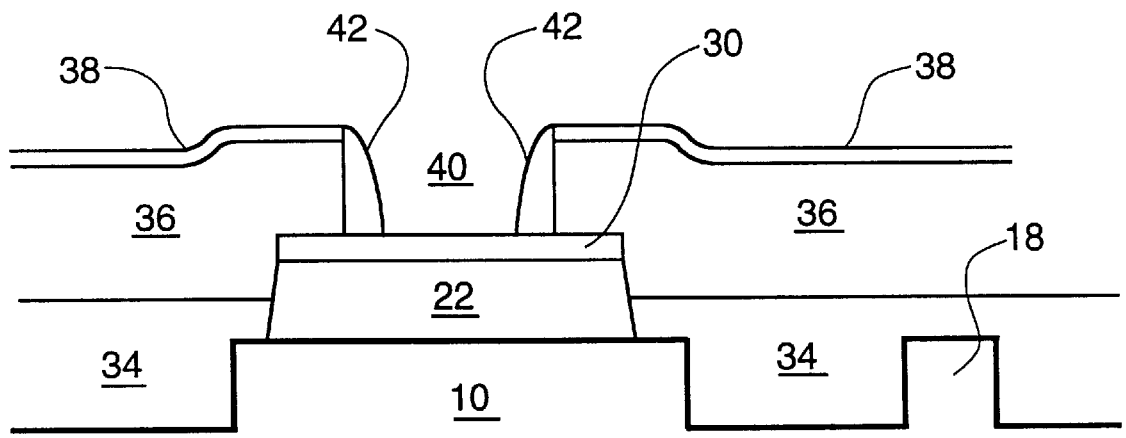
FIG. 10 illustrates the structure of FIG. 9 after a self-aligned spacer is formed on a portion of the silicon nitride layer adjacent the extrinsic base and silicon nitride cap.

In the next step of the process of the invention, a self-aligned spacer 42 is formed in the opening 40 on a portion of the silicon nitride layer 30 and adjacent the extrinsic base 36 and the silicon nitride cap 38. The self-aligned spacer 42 can be silicon dioxide, silicon nitride, or a combination of those materials, and can be formed using processes that are well known to those of skill in the art, such as the conformal deposition of silicon dioxide followed by anisotropic etching. The resulting structure is illustrated in FIG. 10.

Figure 11:
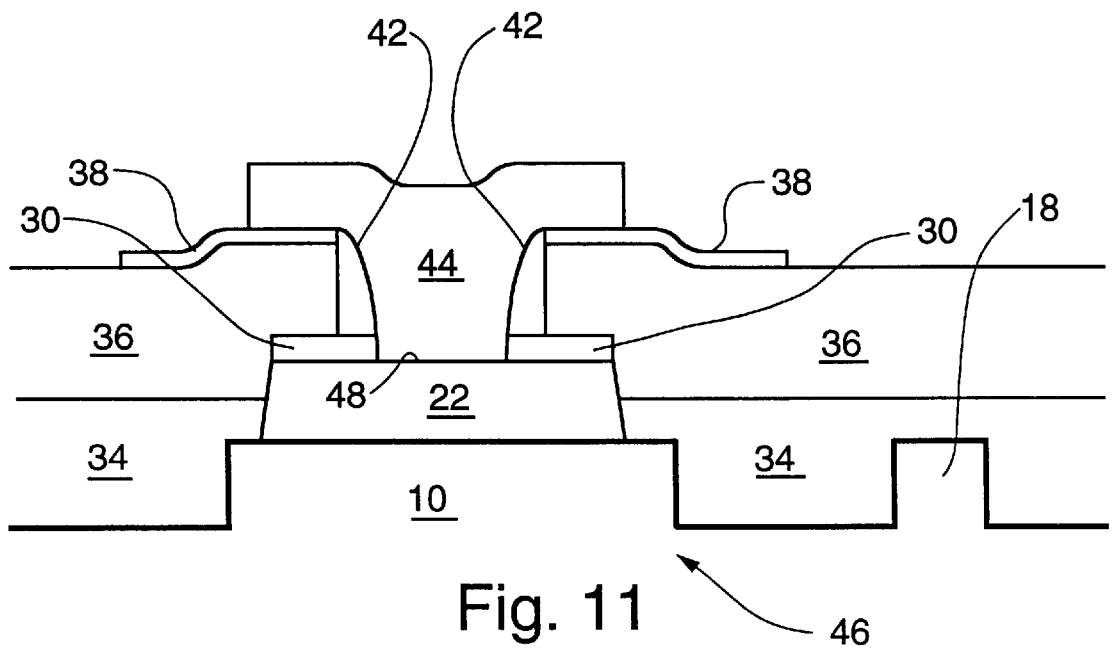
FIG. 11 illustrates the structure of FIG. 10 after the exposed portion of the silicon nitride layer is removed and an emitter has been formed on the exposed portion of the top surface of the silicon-germanium base.

Next, the exposed portion of the silicon nitride layer 30 is removed from the opening 40 such that a portion 48 of the top surface of the silicon-germanium base 22 is exposed. An emitter 44 is then formed on the exposed portion 48 of the top surface of the silicon-germanium base 22 to form a heterojunction bipolar transistor 46. The emitter 44 can be any of those materials conventionally used as an emitter, such as polysilicon, and can be formed using conventional techniques. The resulting structure is illustrated in FIG. 11.

The emitter 44 can be doped with the same dopant type as that used to dope the collector 18. Preferably, the emitter 44 is doped with an n-type dopant. The emitter 44 can be doped using techniques which are well known to those of ordinary skill in the art.

Figure 12:
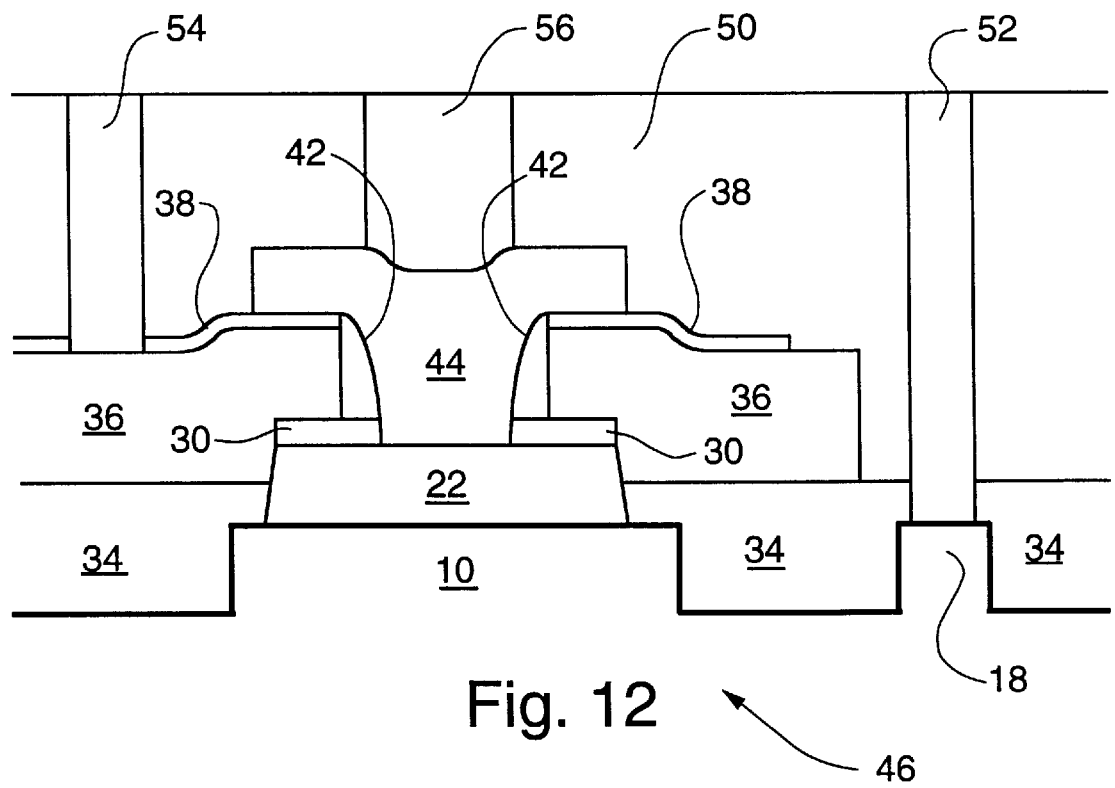
FIG. 12 illustrates the structure of FIG. 11 after an isolation layer and collector, base, and emitter contacts extending through the isolation layer have been formed.

In the next step, an isolation layer 50 is formed on the exposed portions of the extrinsic base 36, silicon nitride cap 38, and emitter 44. The isolation layer 50 can be any of those dielectric materials conventionally used for isolation, such as borophsphosilicate glass (BPSG). Following formation of the isolation layer 50, electrical connections are then made to the collector 18, silicon-germanium base 22, and emitter 44 by forming a collector contact 52, a silicon-germanium base contact 54, and an emitter contact 56, respectively. The collector contact 52, silicon-germanium base contact 54, and emitter contact 56 can be formed using conventional materials and techniques which are well known to those of ordinary skill in the art. Preferably, the collector contact 52, silicon-germanium base contact 54, and emitter contact 56 comprise tungsten. The resulting structure is illustrated in FIG. 12.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A process for forming a silicon-germanium base of a heterojunction bipolar transistor, said process comprising the steps of:

forming a silicon substrate having a mesa surrounded by a trench, said mesa having a top surface;

forming a dielectric layer in said trench adjacent said mesa; and growing a silicon-germanium layer on said mesa top surface using selective epitaxial growth to form said silicon-germanium base, said silicon-germanium base having a side wall with said dielectric layer covering at least one portion of said side wall.

2. The process of claim 1 wherein said silicon-germanium base has a germanium content of from about 10% to about 60%.

3. The process of claim 1 wherein said silicon-germanium base has a thickness of from about 20 nm to about 100.

4. The process of claim 1 wherein said silicon-germanium base has a germanium content of from about 25% to about 60% and a thickness of from about 40 nm to about 80 nm.

5. The process of claim 1 wherein the step of forming a silicon substrate having a mesa surrounded by a trench comprises selectively etching a portion of said silicon substrate to form said trench.

* * * * *